(12) United States Patent
Gierkink

(10) Patent No.: US 7,630,698 B2
(45) Date of Patent: Dec. 8, 2009

(54) FAST SWITCHING, DUAL FREQUENCY PHASE LOCKED LOOP

(75) Inventor: Sander Gierkink, Hoboken, NJ (US)

(73) Assignee: Agere Systems Inc., Allentown, PA (US)

(*) Notice: Subject to any disclaimer, the term of this patent is extended or adjusted under 35 U.S.C. 154(b) by 328 days.

(21) Appl. No.: 11/189,306

(22) Filed: Jul. 26, 2005

(65) Prior Publication Data

US 2007/0026814 A1 Feb. 1, 2007

(51) Int. Cl.
*H04B 1/06* (2006.01)
(52) U.S. Cl. .................... 455/260; 455/259; 455/258; 455/257; 455/255
(58) Field of Classification Search ............ 455/73, 455/255, 256, 260, 259, 258, 257
See application file for complete search history.

(56) References Cited

U.S. PATENT DOCUMENTS

| 4,988,955 | A  | * | 1/1991  | Horie .......................... 331/11   |
| 5,821,789 | A  | * | 10/1998 | Lee ............................. 327/156 |
| 6,686,804 | B1 | * | 2/2004  | Adams et al. ................. 331/17    |
| 7,061,340 | B2 | * | 6/2006  | Boccuzzi et al. ......... 331/177 V      |
| 7,327,196 | B2 | * | 2/2008  | Goldberg ..................... 331/16    |
| 2003/0081653 | A1 | * | 5/2003 | Hardin et al. ............... 375/130    |
| 2003/0119466 | A1 | * | 6/2003 | Goldman ..................... 455/260    |
| 2003/0203743 | A1 | * | 10/2003 | Sugar et al. ............. 455/550.1    |
| 2008/0007365 | A1 | * | 1/2008 | Venuti et al. ................ 331/179   |

* cited by examiner

*Primary Examiner*—Nay A Maung
*Assistant Examiner*—Richard Chan

(57) ABSTRACT

A fast switching, dual frequency phase locked loop comprising dual phase/frequency detectors, dual charge pumps, a pair of loop filters, and a low leakage voltage controlled oscillator. Each phase/frequency detector and associated tuning ports of the voltage controlled oscillator can be activated and deactivated separately without disturbing the charge on the loop filters.

13 Claims, 6 Drawing Sheets

FAST SWITCHING, DUAL FREQUENCY PHASE LOCKED LOOP

BACKGROUND OF THE INVENTION

1. Field of the Invention

The invention relates to transceivers for use in a communications system and, more particularly, to dual frequency phase locked loops for enabling transceivers to operate in multiple modes.

2. Description of the Related Art

In modern communications systems, multiple communications protocols may be used. A variety of protocols arise where each protocol supports a different level of communication service, or where technology improvements have facilitated the development of advanced protocols, but legacy protocols must simultaneously be supported. One example of a communication system that supports multiple protocols is a wireless local area network (LAN). A wireless LAN generally supports the various protocols under IEEE 802.11. The protocols are generally identified by a letter designation such as 802.11a, 802.11b, and 802.11g. When a transceiver uses multiple protocol modes, the multiple designations are listed. For example, a transceiver that uses all three 802.11 protocols is referred to as an 802.11a/b/g transceiver.

When developing a combined 802.11a/b/g transceiver, the choice between zero intermediate frequency (ZIF) and low intermediate frequency (LIF) in the transmit mode (TX) and receive mode (RX) paths is particularly important. The specification of the transmit mask, combined with the limited achievable image rejection, make ZIF the logical choice for use in the transmit mode. In the receive mode however; the choice is less straightforward. In the 802.11b protocol, the possibility of strong adjacent channel interference combined with a limited achievable image rejection more or less dictate ZIF as the appropriate frequency to be used for the receive mode. On the other hand, in the 802.11a/g protocols, the maximum adjacent channel interference is less strong, making LIF attractive in the receive mode because LIF avoids the DC offset problem.

The DC offset in a ZIF receiver has a number of sources including transmitter local oscillator frequency leakage, the receiver local oscillator feed through, and a receiver DC offset in the analog base band. To insure optimal dynamic range at the analog-to-digital converter, a slow varying DC offset can be removed by calibration in the analog domain, while a fast varying DC offset can be removed on a packet-by-packet basis in the digital signal processor.

The removal of the DC offset in a ZIF-based receiver is complicated by the frequency offset between the transmitter and receiver. The transmitter and receiver frequency offset is caused by the limited accuracy of the synthesizer crystal in the transmitter and receiver circuitry. The accuracy is generally ±20 ppm or ±40 ppm for the transmitter and receiver combined. Such inaccuracy requires frequency correction in the digital signal processor to ensure correct positioning of the Orthogonal Frequency Division Multiplexed (OFDM) carriers to avoid signal smearing. In a ZIF receiver, the necessary frequency correction in the 802.11 a/g modes interferes with the DC removal in the digital signal processor. While the DC offset due to the transmitter local oscillator leakage will appear as DC, the receiver DC offset shifts by an amount equal to the transmitter and receiver frequency offset after the frequency correction. This causes possible interference with the first OFDM sub-carrier at 312.5 kHz. Thus, LIF receivers are attractive when using 802.11 a/g protocols.

Summarizing, to produce a multi-mode 802.11 a/b/g transceiver, ZIF transmitter/ZIF receiver is a good choice for operating in 802.11b mode and ZIF transmitter/LIF receiver is a good choice for operating in 802.11a/g modes. However, this combination of receivers and transmitters is rarely used in practice, due to the limited time available to switch local oscillator frequency to accommodate ZIF receive b mode and LIF receive g mode. Switching between ZIF and LIF must occur during a very short period in which the following also occurs the preamble time, burst detection, channel estimation, AGC setting, antenna diversity switching and frequency offset and symbol timing correction. This only leaves a few microseconds to accurately switch the local oscillator frequency from LIF to ZIF modes, or vice versa. A conventional integer-N phase locked loop is unable to switch the local oscillator fast enough to accommodate both ZIF and LIF modes in a transceiver.

Therefore, there is a need in the art for a fast switching, dual frequency phase locked loop to facilitate the use of multiple operational modes and/or protocols in a transceiver.

SUMMARY OF THE INVENTION

The present invention is a fast switching, dual frequency phase locked loop. The inventive phase locked loop comprises dual phase/frequency detectors, dual charge pumps, a pair of loop filters, and a low leakage voltage controlled oscillator. Each phase/frequency detector and associated tune ports of the voltage controlled oscillator can be activated and deactivated separately without disturbing the charge in the loop filters. As such, one embodiment of the phase locked loop can switch in about 6 µS across a 7 MHz frequency span with a better than ±20 kHz accuracy.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
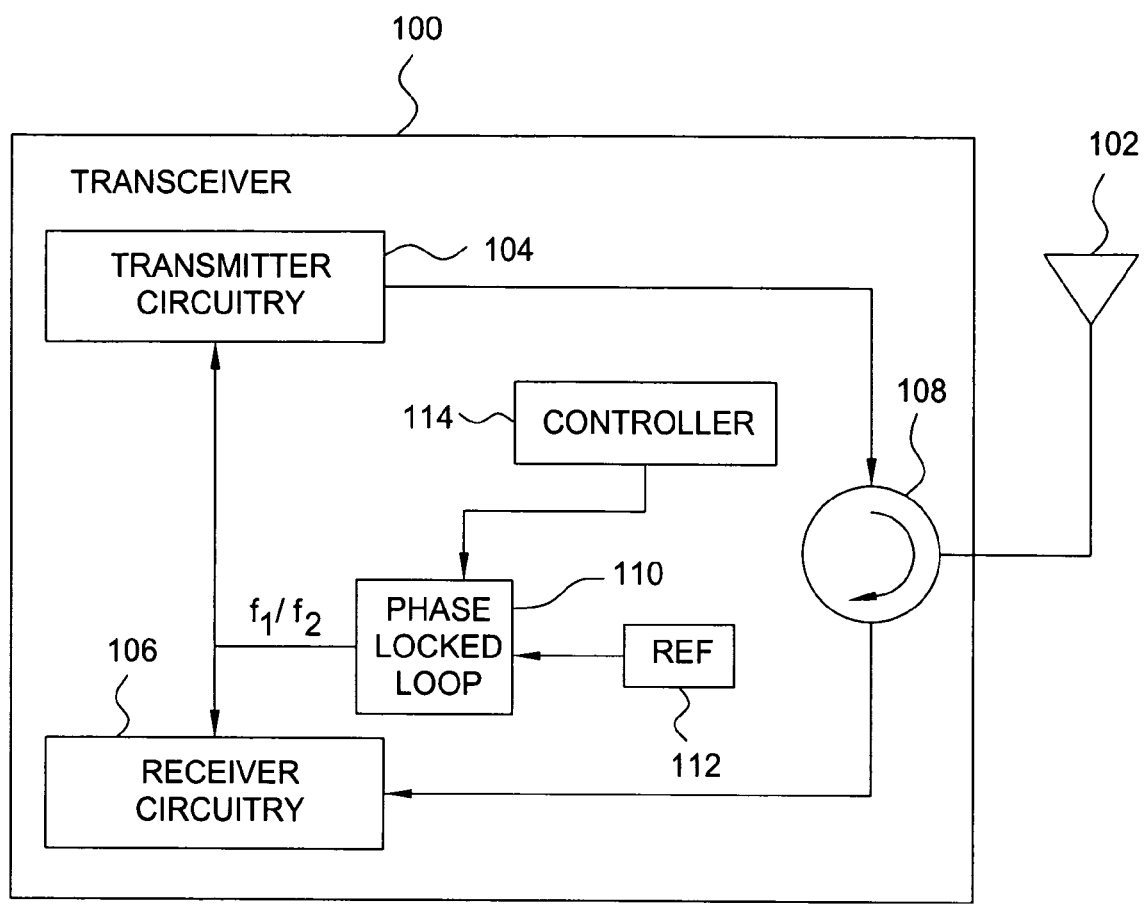
FIG. 1 is a block diagram of a transceiver in accordance with the present invention.

FIG. 1 depicts a block diagram of a wireless transceiver 100 coupled to an antenna 102 that utilizes a dual frequency phase locked loop 110 of the present invention. Although the dual frequency phase locked loop is depicted and described in combination with wireless transceiver circuitry, those skilled in the art will realize that the invention is useful in any application requiring a fast switching, dual frequency phase locked loop.

The transceiver 100 comprises transmitter circuitry 104, receiver circuitry 106, a circulator 108, a reference oscillator 112, a controller 114, and the phase locked loop 110. The reference oscillator 112, e.g., a crystal oscillator, provides a reference frequency to the phase locked loop 110. The controller 114 provides control signals to control (switch) the frequency of the phase locked loop 110 to support various operational modes and/or protocols for the transceiver. The phase locked loop 110 provides a reference frequency to both the receiver and transmitter circuitry. In one embodiment of the invention, the transceiver 100 is a combined 802.11a/b/g transceiver. By using the phase locked loop of the present invention, the transceiver 100 may operate in either ZIF or LIF modes at the convenience of the controller 114.

Figure 2:
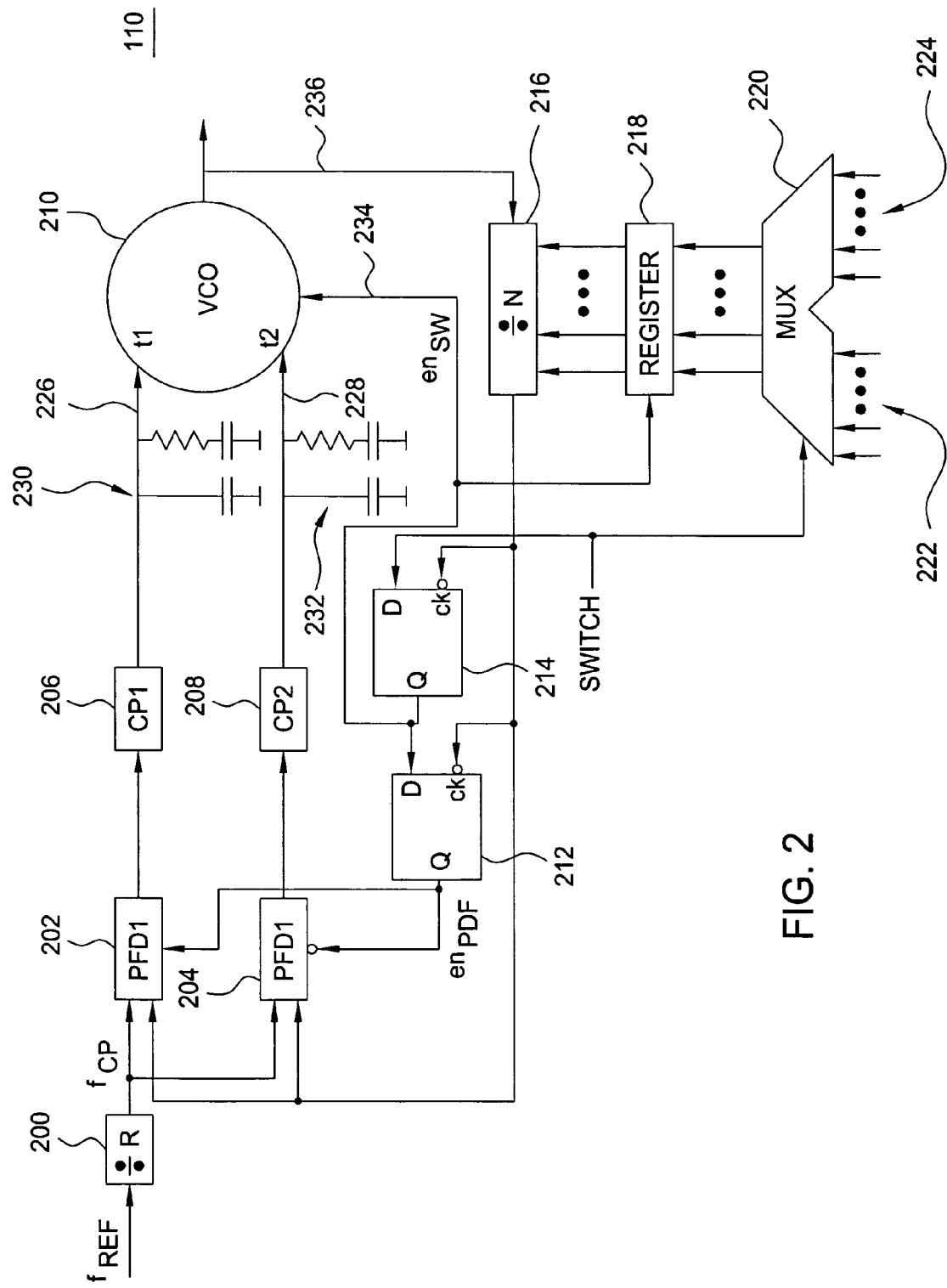
FIG. 2 is a block diagram of a phase locked loop in accordance with the present invention.

FIG. 2 depicts a block diagram of the phase locked loop 110 of the present invention. The phase locked loop 110 comprises a divide-by-R circuit 200 that reduces the frequency ($f_{REF}$) of the reference oscillator, where R is an integer that is greater than zero. The reduced reference frequency is coupled to a pair of phase/frequency detectors 202 and 204. The outputs of the phase/frequency detectors 202 and 204 are respectively coupled to a pair of charge pumps 206 and 208. The outputs of the charge pumps are respectively coupled to a pair of low pass filters 230 and 232. Each of the filter outputs are respectively coupled to independent tuning ports 226 and 228 of a voltage controlled oscillator (VCO) 210. In this manner, the outputs from the phase/frequency detectors 202 and 204 are coupled through the charge pumps 206 and 208, and through the filters 230 and 232, to the tuning ports of the VCO 210.

The frequency of the VCO 210 is selected using a multiplexer 220 having two N-bit digital control ports 222 and 224 that provide digital control signals for setting the frequency of the phase locked loop 110. The multiplexer 220 is controlled by a SWITCH signal supplied by the controller 114 to switch between the two input ports 222 and 224 of the multiplexer 220. The output of the multiplexer 220 is coupled to a register 218 that outputs its digital signal to a divide by N circuit 216. The divide by N circuit 216 reduces the VCO output frequency to a value that is compatible with the reduced reference frequency to facilitate operation of the phase/frequency detectors 202 and 204. The reduced VCO frequency is used to clock a pair of D flip flops 212 and 214. The flip flops 212 and 214 control the phase/frequency detectors 202 and 204 as well as select the active tuning port for the VCO on path 234. The output of the VCO 210 appears on path 236, which is used by the receiver and transmitter circuitry 104 and 106 as well as coupled to the divide by N circuit 216.

The phase/frequency detectors 202 and 204 operate on rising edges only. Assuming the phase locked loop is in lock, the principal of operation is as follows: an external switch command (SWITCH signal) is retimed by a rising edge of the divider output, upon completion of a full division. This activates the enable signal created by flip-flop 214 to select a particular tuning port 226 or 228 of the VCO 210 and changes the division ratio of the circuit 216 from N1 to N2. Simultaneously, the currently active phase frequency detector 202 or 204 performs its last phase comparison. The next falling edge of the divider output activates the enable phase/frequency detector/signal ($en_{PFD}$) to switch the phase/frequency detectors from detector 202 to detector 204, or vice versa. This retiming ensures that the switching of the two phase/frequency detectors does not coincide with a phase comparison and that the divider ratio only changes after completion of a full division.

To achieve fast switching speeds, it is critical to minimize charge leakage of the loop filters 230 and 232 when their corresponding phase frequency detector and tuning port are disabled. With such low leakage, no update or correction of the loop filter charge is required upon reactivation of the port, and fast lock is achieved. To achieve low leakage, the VCO tuning ports 226 and 228 are designed without placing "leaky" p-n junctions parallel to the loop filters, other than the unavoidable junctions of the output transistors of the charge pumps 206 and 208. The phase locked loop 110 requires a short learning period to setup the loop filter charge, after which, the loop filters ideally require no settling time to switch from one frequency to another.

Figure 3:
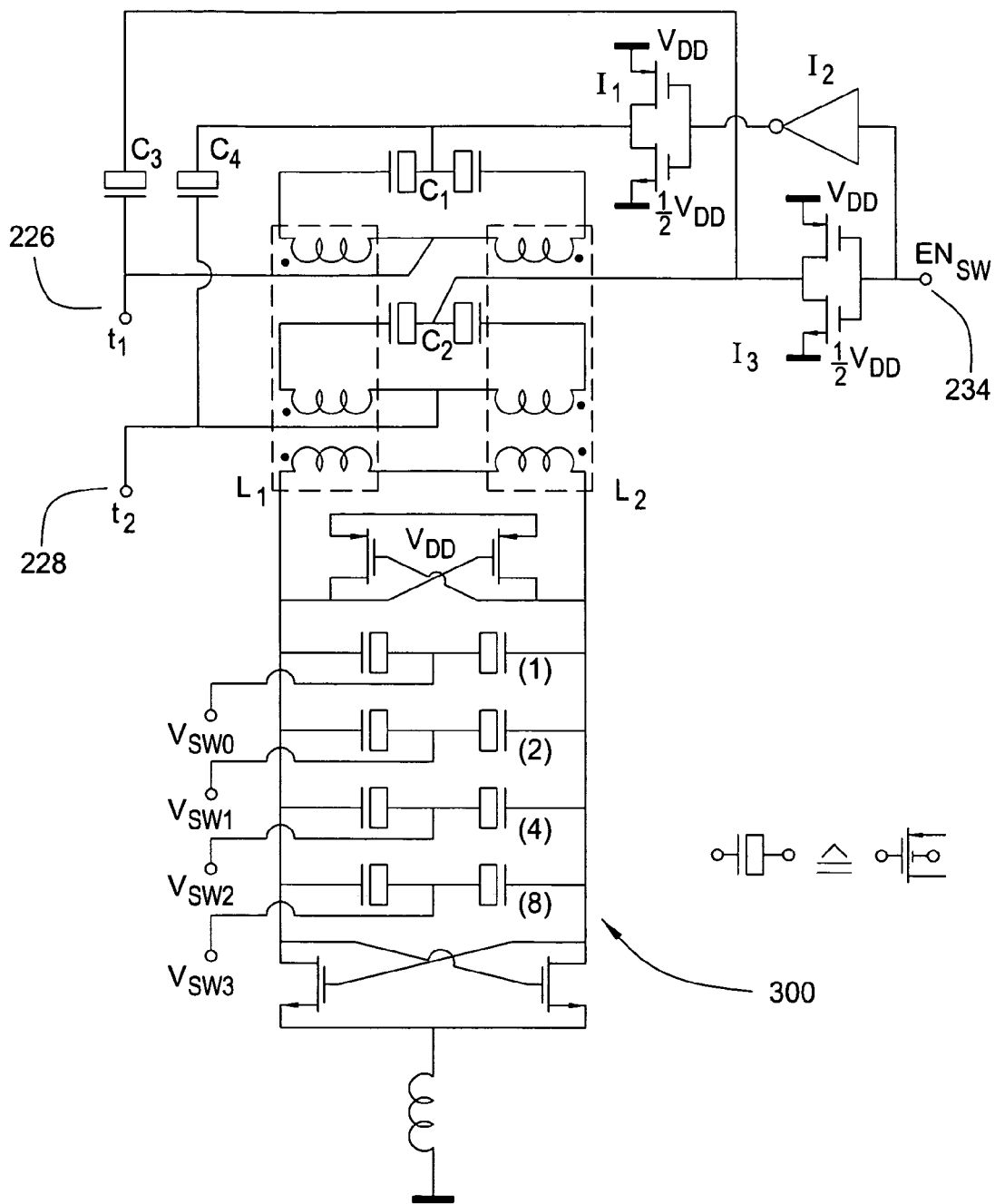
FIG. 3 is a schematic diagram of a voltage controlled oscillator used in the phase locked loop of FIG. 2.

FIG. 3 depicts a schematic diagram of the VCO 210. The oscillator 210 features two tuning ports 226 and 228 that control MOSFET accumulation-depletion varactor sets $C_{1,2}$. The inductors $L_{1,2}$ each consist of three electromagnetically coupled coils that inductively couple $C_{1,2}$ to a tank circuit. Consequently, both the gate-and well-sides of the varactor sets $C_{1,2}$ can be controlled. Low leakage tuning is accomplished by applying the tuning voltage to the gate side of each varactor through the common mode points of the coils $L_1$ and $L_2$. Normally, a varactor is tuned at the well-side; however, for this application, the leakage of the well-substrate junction is undesirable. The invertors $I_{1,2,3}$ control the selection of the tuning ports 226 and 228. For example, tuning port 226 is enabled by switching the well-side of varactor $C_1$ from $V_{DD}$ to $0.5(V_{DD})$. This biases the varactor at the maximum sensitivity for tuning voltages around the $0.5V_{DD}$ voltage level, as the derivative of the C(V)-curve is maximum around the $V_{gate-well}=0$ volts. Simultaneously, the well-side of varactor $C_2$, corresponding to tuning port 228 is switched to $V_{DD}$, lowering its $V_{gate-well}$ voltage below 0 Volts, thereby significantly lowering the varactor capacitance and tuning sensitivity. The switching action is reversed when tuning port 228 is enabled. Coarse tuning of the VCO 210 is provided by band switches 300. A separate control circuit (not shown) selects the appropriate combination of band switches for use during the initialization phase.

In summary, switching the varactor well-side between $V_{DD}$ and $0.5V_{DD}$ changes the amount and sensitivity by which the corresponding tuning voltage contributes to the frequency of the oscillation. Thus, the phase locked loop 110 is able to discriminate between two frequencies without having to change the tuning voltages. Switching the well-sides also avoids placing any switches with leaky p-n junctions between the loop filters 230 and 232 and the tuning ports 226 and 228.

When a tuning port is disabled, the varactor experiences a step like change in its gate-well voltage, and thus in its capacitance and stored charge. This causes a small charge interchange between the varactor gate and the loop filter. As a result, a tiny step-like change appears on the loop filter voltage, at the instant of switching. However, upon re-enabling the tuning port, this instantaneous charge sharing process is reversed as the switching process is now exactly reversed. Therefore, the loop filter will show the same constant voltage in a given mode (either LIF or ZIF) after making several switches provided that the tuning ports do not leak charge. Although not necessary for the operation of the phase locked loop 110, varactors $C_{3,4}$ can be added to the VCO 210 to compensate for the aforementioned charge exchange.

The phase locked loop 110 is realized using a 0.25 μm silicon-germanium (SiGe) CMOS process. For use in a multimode 802.11 transceiver, the VCO operates at about 3.5 GHz.

By division and mixing, 5 GHz and 2.5 GHz local oscillator frequencies for 802.11a/b/g modes can be obtained.

All measurement results presented below were obtained using a buffered voltage controlled oscillator output. The loop bandwidth was measured to be about 50 kHz. The normal charge pump frequency is 5/3 MHz, obtained from a 20 MHz crystal. The VCO coarse tuning is performed using an automatic tuning circuit that monitors the loop filter voltage and selects the correct band switches 300. This guarantees that the loop filter voltage lies within the optimum range of the charge pump and VCO.

In the tested integrated circuit, the on-chip loop filters consisted of poly resistors and linear, low leakage, high-density MOSFET accumulation capacitors. The inductors $L_{1,2}$ are fabricated using a thick aluminum metal, five layer process.

Figure 4:
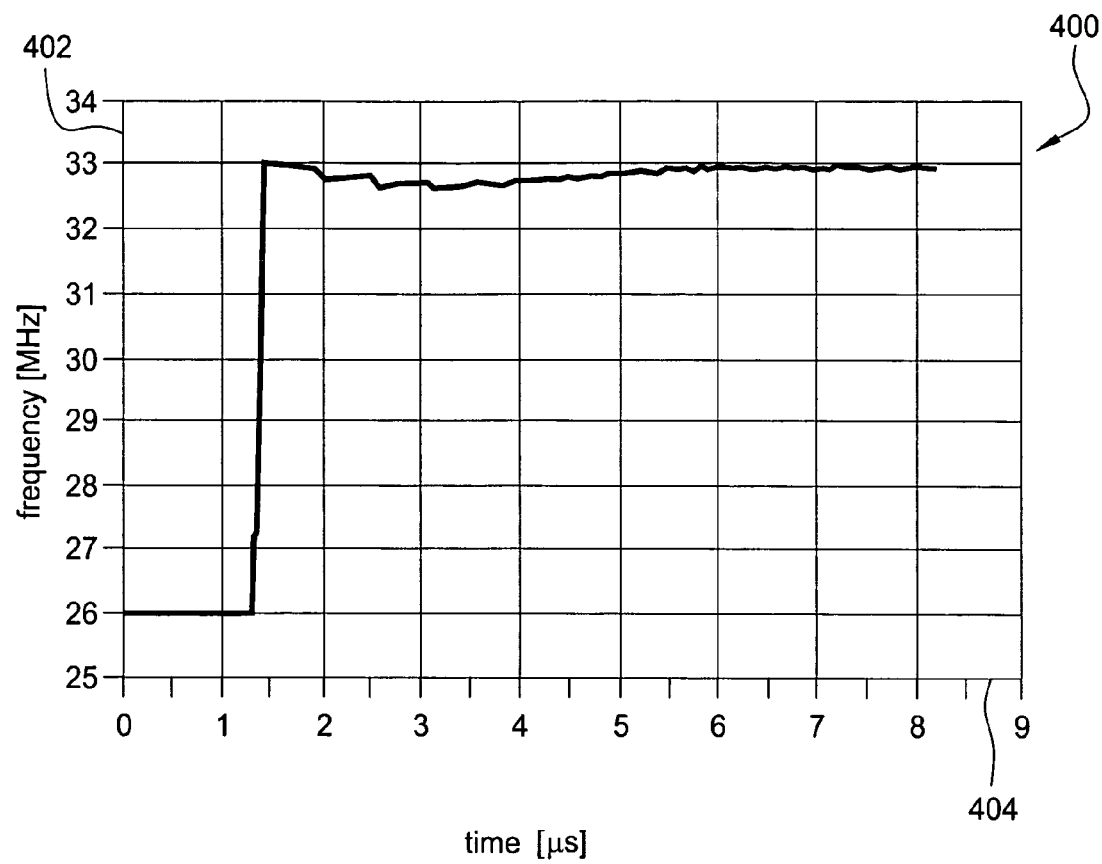
FIG. 4 is a graph of frequency versus time for the switched phase locked loop of the present invention.

FIG. 4 depicts a graph 400 of a measurement of frequency (axis 402) versus time (axis 404). The phase/frequency detector reference frequency in this measurement is 21 MHz/12= (7/4)MHz, corresponding to a 0.6 microsecond period. The phase locked loop division ratio N is switched between 2,072 and 2,076, at a rate of 1 Hz. As a result, the VCO switches over 7 MHz, between 3.626 GHz and 3.63 GHz. The result is obtained by down converting the VCO output to 26 MHz and recording the output using a digital sampling scope. A computer program extracts all zero crossings. Due to the limited accuracy of the sampling scope, the frequency accuracy is limited to roughly ±20 kHz.

FIG. 4 shows the initial frequency change is completed accurately almost instantaneously. This confirms that there is no significant charge leakage occurring on the loop filters and that the phase locked loop is able to rapidly switch its output frequency.

Figure 5:
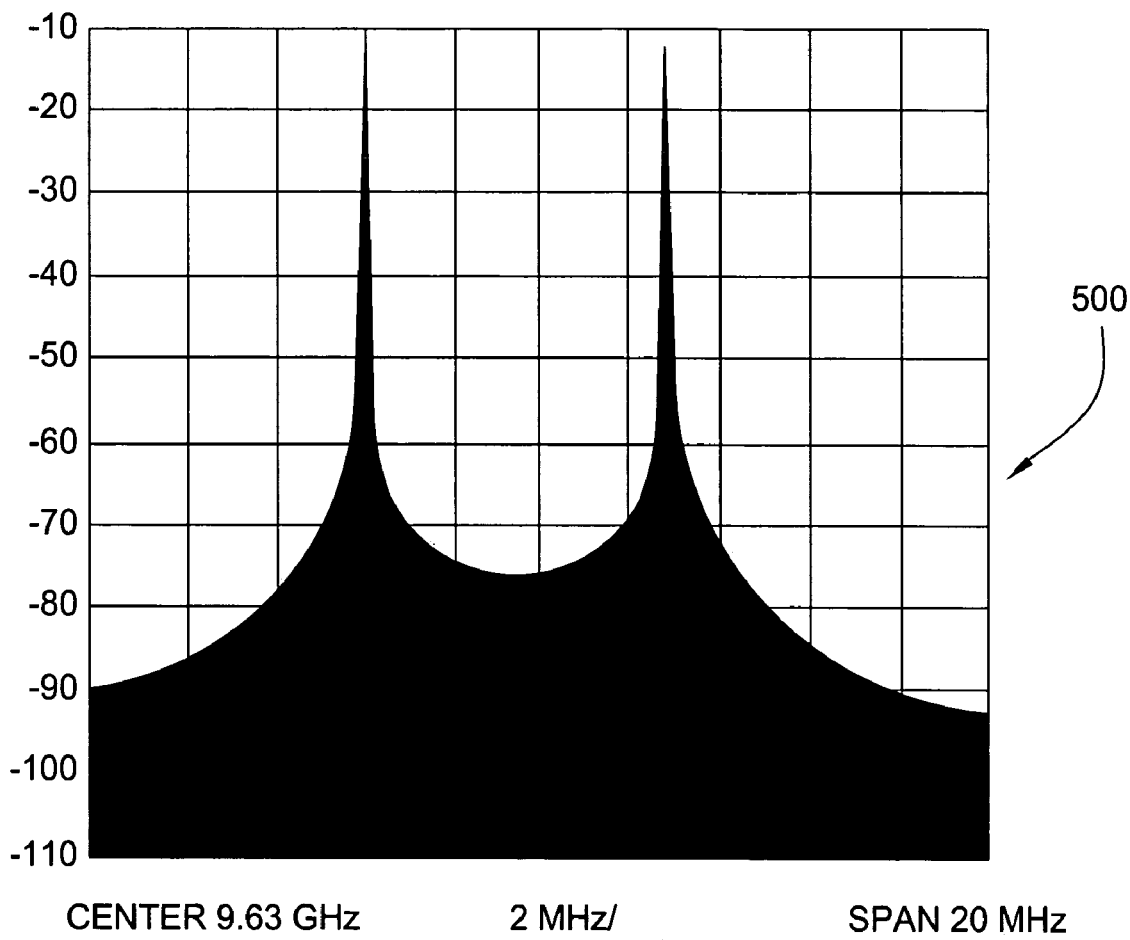
FIG. 5 depicts a graph of the frequency spectrum of the phase locked loop output during continuous switching.
Figure 6:
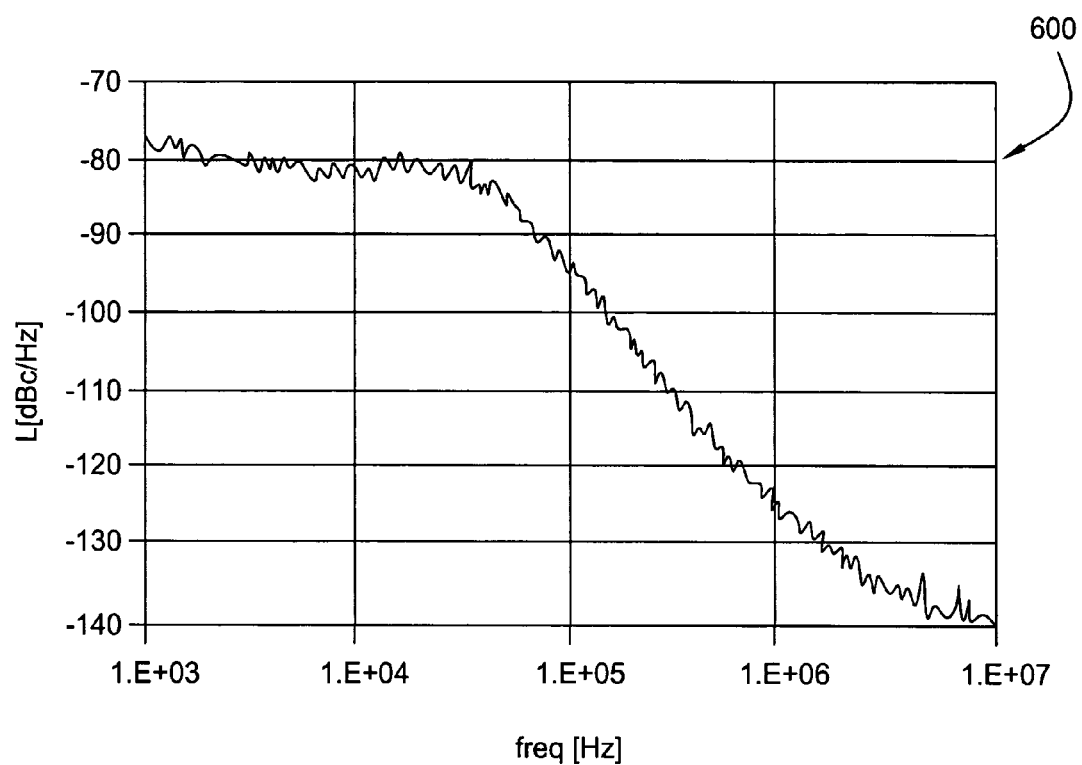
FIG. 6 is a graph of the phase noise of the phase locked loop of the present invention.

FIG. 5 depicts a graph 500 of the measured VCO output spectrum when the phase locked loop is switched continuously at a rate of 10 kHz. The plot is obtained by using a large sweep time, such that both peaks are captured accurately in one spectral plot. FIG. 6 depicts a graph 600 of the measured phase locked loop phase noise at the VCO output.

As can be seen from the results that are obtained by measuring the output of the phase locked loop 110, the phase locked loop provides a fast switching, dual frequency output that can be used in any transceiver or other circuitry requiring dual frequencies. In one embodiment of the invention, the dual frequency phase locked loop is used in a combined 802.11 a/b/g transceiver that utilizes both ZIF and LIF modes. Specifically, in 802.11b mode the receiver and transmitter circuitry operates with ZIF and, in 802.11 a/g mode, the transmitter circuitry operates with ZIF and the receiver circuitry operates with LIF.

While the foregoing is directed to embodiments of the present invention, other and further embodiments of the invention may be devised without departing from the basic scope thereof, and the scope thereof is determined by the claims that follow.

The invention claimed is:

1. A phase locked loop comprising:
   a first phase/frequency detector and a second phase/frequency detector, each having two inputs and one output;
   a first charge pump coupled to the output of the first phase/frequency detector;
   a second charge pump coupled to the output of the second phase/frequency detector;
   a first loop filter coupled to an output of the first charge pump and coupled to a first tuning port of a voltage controlled oscillator;
   a second loop filter coupled to an output of the second charge pump and coupled to a second tuning port of a voltage controlled oscillator;
   the voltage controlled oscillator having an output that is coupled to the first and second phase/frequency detectors, and having first and second tuning ports with low leakage, wherein a charge accumulated in the second loop filter coupled between the second phase/frequency detector and the second tuning port does not discharge while the second tuning port is deactivated; and
   control circuitry, responsive to an input switch signal, configured to cause the voltage controlled oscillator to either
   i) activate the first tuning port and the first phase/frequency detector and deactivate the second tuning port and second phase/frequency detector, or
   ii) activate the second tuning port and second phase/frequency detector and deactivate the first tuning port and first phase/frequency detector.

2. The phase locked loop of claim 1 wherein the voltage controlled oscillator further comprises:
   a first varactor having a gate-side coupled to the first tuning port and a well-side coupled to at least one first inductor; and
   a second varactor having a gate-side coupled to the second tuning port and a well-side coupled to at least one second inductor.

3. The phase locked loop of claim 2 further comprising:
   a third varactor connected between the first tuning port and the well-side of second varactor; and
   a fourth varactor connected between the second tuning port and the well-side of the first varactor.

4. The phase locked loop of claim 1 wherein the control circuitry selects an output frequency for the voltage controlled oscillator.

5. The phase locked loop of claim 2 wherein the first and second varactors are accumulation-depletion varactors.

6. The phase locked loop of claim 2 wherein the first tuning port is activated by applying a bias voltage to the well-side of the first varactor; and the second tuning port is activated by applying a bias voltage to the well-side of the second varactor.

7. The phase locked loop of claim 1, wherein the phase locked loop is a component of a transceiver, the transceiver comprising:
   receiver circuitry;
   transmitter circuitry;
   wherein the phase locked loop is coupled to the receiver circuitry and the transmitter circuitry so as to switchably supply at least two frequencies to enable the receiver circuitry and the transmitter circuitry to operate either with a zero intermediate frequency and/or a low intermediate frequency.

8. The transceiver of claim 7 wherein the phase locked loop switches between two frequencies in about 6 µs.

9. The transceiver of claim 7 wherein the receiver and the transmitter circuitry can operate in multiple modes that support various IEEE 802.11 protocols.

10. The transceiver of claim 7 wherein the transmitter circuitry operates with a zero immediate frequency and the receiver circuitry operates either with zero intermediate frequency or low intermediate frequency.

11. The transceiver of claim 10 wherein the receiver and transmitter circuitry uses zero intermediate frequency to support an IEEE 802.11b protocol, and to support an IEEE 802.11a/g protocols, the transmitter circuitry uses zero intermediate frequency and the receiver circuitry uses low intermediate frequency.

12. A method of operating a phase locked loop comprising:

generating a switch signal for control circuitry;

causing, by the control circuitry in response to the switch signal, the voltage controlled oscillator to select an output frequency of a voltage controlled oscillator by either:

activating a first phase/frequency detector and a first tuning port of the voltage controlled oscillator, while simultaneously deactivating a second phase/frequency detector and a second tuning port of the voltage controlled oscillator, the first tuning port and the second tuning port having low leakage, wherein a charge accumulated in a loop filter coupled between the second phase/frequency detector and the second tuning port does not discharge while the second tuning port is deactivated, or activating a second phase/frequency detector and a second tuning port of the voltage controlled oscillator, while simultaneously deactivating a first phase/frequency detector and a first tuning port of the voltage controlled oscillator, the first tuning port and the second tuning port having low leakage, wherein a charge accumulated in a loop filter coupled between the first phase/frequency detector and the first tuning port does not discharge while the first tuning port is deactivated.

13. The method of claim 12 wherein the first tuning port and the second tuning port are deactivated by applying a predefined step in voltage across gate-well connections of a varactor.

* * * * *